United States Patent [19]

Quinlan

[11] Patent Number: 5,824,206
[45] Date of Patent: Oct. 20, 1998

[54] PHOTOELECTROCHEMICAL ETCHING OF P-INP

[75] Inventor: Kenneth P. Quinlan, Newton, Mass.

[73] Assignee: The United States of America as represented by the Secretary of the Air Force, Washington, D.C.

[21] Appl. No.: 674,229

[22] Filed: Jun. 28, 1996

[51] Int. Cl.⁶ ................................................ C25F 3/12
[52] U.S. Cl. ...................... 205/646; 205/655; 205/685
[58] Field of Search ................................ 205/655, 646, 205/685, 661

[56] References Cited

U.S. PATENT DOCUMENTS

| | | | |
|---|---|---|---|
| 4,351,706 | 9/1982 | Chappell et al. | 204/129.3 |
| 4,369,099 | 1/1983 | Kohl et al. | 205/655 |
| 4,404,072 | 9/1983 | Kohl et al. | 204/129.3 |
| 4,518,456 | 5/1985 | Bjorkholm | 156/626 |
| 4,705,593 | 11/1987 | Haigh et al. | 156/635 |
| 5,288,372 | 2/1994 | Baker et al. | 205/661 |
| 5,338,394 | 8/1994 | Fathimulla et al. | 156/643 |

OTHER PUBLICATIONS

Kohl, P.A.; et al, "p-InP Photoetching," J. Electrochem. Soc., vol. 137, No. 10, Oct. 90, 3315–3316.

Kohl, P.A.; et al. "The Photoelectrochemical Etching of (100) and (TTT) p–InP," J. Electrochemical Soc., vol. 138, No. 2, Feb. 91, 608–613.

Kohl, Paul A., et al., "Photoelectrochemical Methods for Semiconductor Device Processing," Electrochimica Acta, vol. 38, No. 1, 1993, 101–106 no month available.

Ostermayer, F. W. Jr. et al., "Photoelectrochemical etching of p–GaAs." Appl. Phys. Lett. 39(1), 1 Jul. 81, 76–78.

*Primary Examiner*—Kathryn L. Gorgos
*Assistant Examiner*—Kishor Mayekar
*Attorney, Agent, or Firm*—Stanton E. Collier

[57] ABSTRACT

Photoelectrochemical etching of p-InP in various nitric acid solutions demonstrates that the semiconductor undergoes etching with favorable etch rates in the negative potential region. The etch rate increases with decreasing potentials to −1.0 V and exhibits a slight decrease with lower potentials. Etch rates exhibit a linear relation with relative light intensity. The values of etch rate for p-InP polarized at −1.0 V vary from 0.07 to 1.24 $\mu$m/min. for $HNO_3$ solutions with concentrations ranging from 1.0 to 5.0 M. Etch rates determined in the 4 M acid range were reproducible within 4%. With acid concentrations greater than 5 M, the etch rates were observed to be inconsistent. XPS studies indicated that these inconsistencies are probably due to the formation of organic nitrogen compounds on the surface of p-InP.

9 Claims, 3 Drawing Sheets

PHOTOELECTROCHEMICAL ETCHING OF P-INP

STATEMENT OF GOVERNMENT INTEREST

The invention described herein may be manufactured and used by or for the Government for governmental purposes without the payment of any royalty thereon.

BACKGROUND OF THE INVENTION

Photoelectrochemical (PEC) techniques have been successful in the spatial selective etching of III-V semiconductors where the etched area is governed by the image of the light. This technique has been used for the fabrication of various products: diffraction gratings, lenses, pin photodetectors, etc. Selective etching with the type semiconductors. When light of energy greater than the band gap is focused on the surfaces of n-type semiconductors, electrons and holes are produced and the electrons and holes are swept to the bulk and surface, respectively. The holes at the surface weaken the bonding of the semiconductor where it becomes susceptible to oxidation and etching.

One major disadvantage of PEC technique is that many of the p-type semiconductors cannot be selectively etched. When p-type superconductors are irradiated with light, electrons and holes are formed but now the electrons are driven to the surface and the holes toward the bulk. The surface of the p-semiconductor is now receptive to reduction.

Ostermayer and Kohl have devised a unique method, based on the reduction of the surface, to etch the p-type semiconductors. The reduction species formed in the photoelectrochemical reaction of the semiconductor is oxidized to a soluble product. The PEC mechanism of the etching, e.g. with p-InP, consists of reducing the semiconductor at negative potentials to form indium on the surface. The potential is then shifted to positive values where the indium is oxidized and dissolved. At positive potentials, the concentration of holes on the surface of p-InP is greatly increased which facilitates the oxidation of the indium. The shift in potential must be repeated several times in order to achieve ample etching.

SUMMARY OF THE INVENTION

The present invention relates to processing of semiconductor material, and, in particular, relates to the etch processing of InP.

The present invention involves the photoelectrochemical etching of p-InP in various nitric acid solutions and it is shown that the semiconductor undergoes etching with favorable etch rates in the negative potential region. The etch rate increases with decreasing potentials to −1.0 V and exhibits a slight decrease with lower potentials. Etch rates exhibit a linear relation with relative light intensity. The values of etch rate for p-InP polarized at −1.0 V vary from 0.07 to 1.24 $\mu$m/min. for $HNO_3$ solutions with concentrations ranging from 1.0 to 5.0 M. Etch rates determined in the 4 M acid range were reproducible within 4%. With acid concentrations greater than 5 M, the etch rates were observed to be inconsistent. XPS studies indicated that these inconsistencies are probably due to the formation of organic nitrogen compounds on the surface of p-InP.

DETAILED DESCRIPTION OF THE PREFERRED EMBODIMENT

The present invention provides a photoelectrochemical method of etching p-InP without the necessary shifting in potential as disclosed in the prior art. Previous experiments at this laboratory have demonstrated that metallic indium is soluble in nitric acid. PEC experiments show that the indium formed at negative potentials with irradiation can be dissolved readily in nitric acid to form etched holes on the surface. Etching studies showed that there was no competition from nitric acid etching the p-InP, since the dark etch rate is minimum, e.g. the etch rate is 24 A/min. in 2.2 M $HNO_3$.

Figure 1:
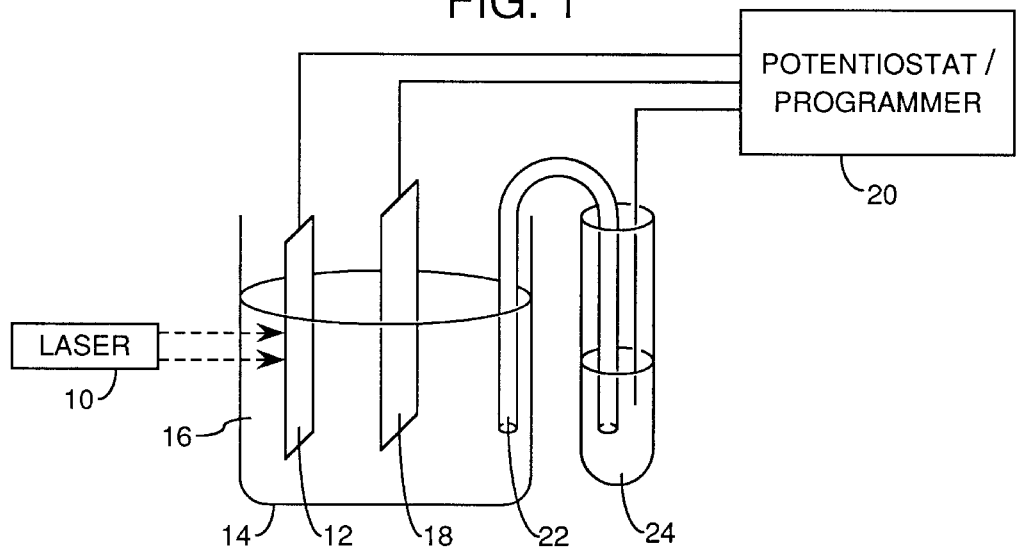
FIG. 1 illustrates the equipment setup for demonstrating the process of the present invention.

The experimental setup is shown in FIG. 1 wherein a He/Ne laser operating at about 1.9 mW is directed at a p-InP wafer 12 acting as one electrode in a container 14 filled with an electrolyte 16 of about 2.2 M $HNO_3$. A counter electrode 18 made of platinum is connected to an potentiostat 20. A salt bridge 22 is inserted into the electrolyte 16 and contacted with calomel reference electrode 24. The reference electrode 24 is also connected to the potentiostat/programmer 20.

The p-InP(Zn) wafers were obtained from Sumitomo Electric industries, Ltd. with an orientation of (100)±0.5°. The carrier concentrations of the samples were $5.1 \times 10^{18}$ $cm^{-3}$ with mobilities of $5.0 \times 10^1$ $cm^2$/v-s. The resistivity was $2.4 \times 10^{-2}$ ohm-cm. The wafers were degreased with toluene, trichloroethane, acetone and methanol. Electrodes with dimensions of 1.5 cm×0.5 cm were fabricated. Electrical contacts were made to the end segment of the p-InP electrodes by attaching a Pt wire with indium under hydrogen at 360° C. The electrodes, before each run, were etched with Caro's acid (5 $H_2SO_4$:1 $H_2O_2$)$_2$:1 $H_2O$) for 5 min; followed by a 2 min etch with 1 vol. % $Br_2$ in methanol.

The chemicals used in the study were of reagent grade, and the water was distilled and deionized. The various $HNO_3$, solutions were prepared by diluting the appropriate amount of acid (70%, Fisher Reagent) to 100 ml. The nitric acid solutions were deaerated with nitrogen for 20 min before the etching measurements. The solutions were stirred during the experiment by purging with $N_2$.

PEC etching experiments were performed in quartz optical cells (5 cm×5 cm×1 cm) containing the p-InP (working electrode), a Pt counterelectrode (2 $cm^2$), a saturated potassium chloride-agar salt bridge connecting a saturated calomel reference electrode (SCE). The p-InP electrodes were positioned in the nitric acid solutions with the electrical contact above the level of the electrolyte. Potentials of −0.1 to −1.4 V were applied to the p-InP electrode by a Princeton Applied Research (PAR) Model 173 potentiostat with the PAR Model 175 programmer. The current was monitored with a PAR Model 176 current follower. All potentials are referred to the SCE.

A typical PEC etching experiment was initiated by applying the designated potential to the p-InP electrode 12, followed by irradiating a spot on the electrode surface with light (632.8 nm) from a 1.9 mW He-Ne laser 10 (Aerotech, Inc.). The beam diameter was approximately 0.13 cm. The duration of the irradiation was 20 min. The p-InP electrode was removed, washed with water, and air-dried with helium. The depths of the etched holes were determined with a Dektak II A surface profile measuring system (Sloan Technology, Santa Barbara, Calif.). The etch rates were determined from the hole depths.

The surface of the p-InP electrodes were examined with Auger electron spectroscopy (AES) and X-ray photoelectron spectroscopy (XPS). AES, used to study the etched hole and adjacent area, was performed with a Varian Model 981-2707 with a base pressure of $10^{-9}$ Torr. AES was used to study the etched hole since its electron beam (5 KeV) could be focused to a ~5 $\mu$m diameter spot. The XPS was a modified AEI ES-100 electron spectrometer using MgK (hv=1253.6 eV) radiation. The base pressure of the chamber was of the order of $10^{-8}$ torr. The XPS peaks for the following elements were studied: In 3d, P 2p, O 1s, and N 1s.

RESULTS AND DISCUSSION

The chemical process underlying the present PEC method is described by the following two equations:

$$p\text{-InP} + 3H^+ 3\ e^- \rightarrow In + PH_3 \quad (1)$$

$$In + 3HNO_3 \rightarrow In^{+3} + 3NO_3 + 3/2\ H_2 \quad (2)$$

The formation of metallic indium on the p-InP surfaces has been verified in a number of studies. Kohl et al. have reported that the photoproduction of indium occurs at potentials which are negative of 0 V and positive of that for the photoreduction of H. Calculations of the free energy of Eq. 2, using the thermal data, gives a favorable value of −23.7 kcal/mole.

Figure 2:
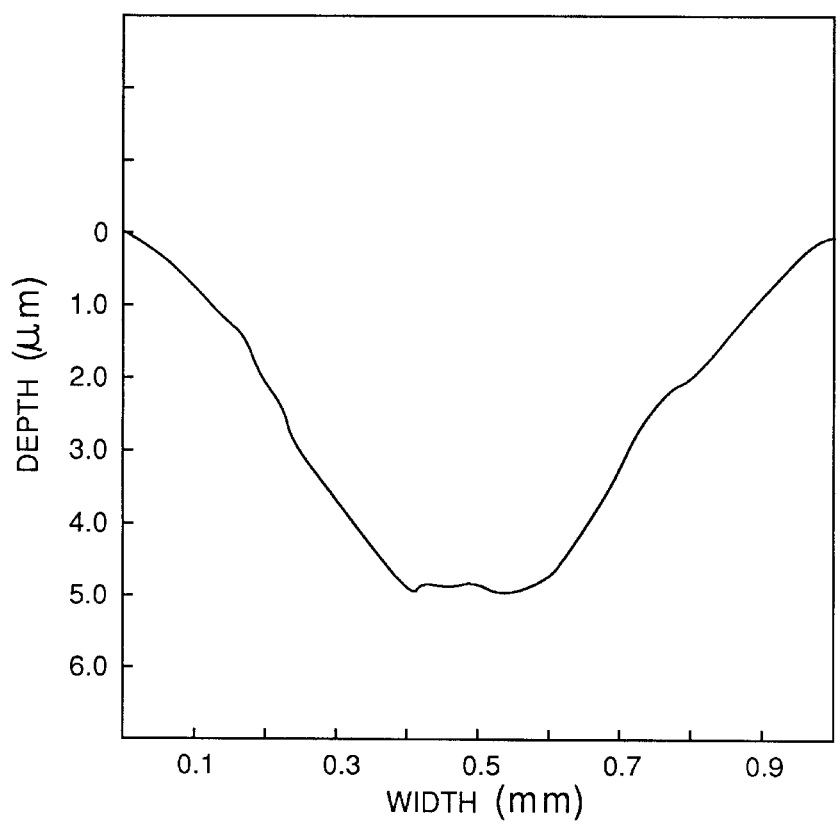
FIG. 2 illustrates the profile of the etched hole from the photoelectrochemical etching of p-InP in nitric acid solution. Electrolyte, 2.2 M $HNO_3$; voltage, −1.0 V; light source, He-Ne laser (1.9 mW); duration of experiment, 20 min.
Figure 3:
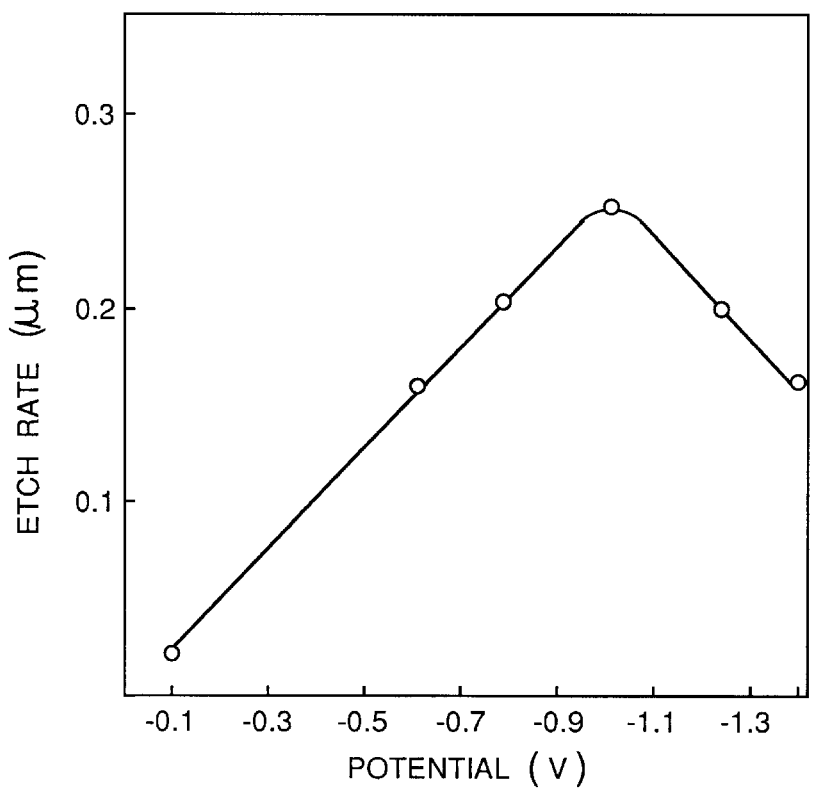
FIG. 3 illustrates the photoelectrochemical etch rate of p-InP vs. potential in nitric acid solutions. Electrolyte, 2.2 M $HNO_3$ light source, He-Ne laser (1.9 mW); duration of experiments, 20 min.

Irradiation of the p-InP electrodes at potentials of −0.1 to −1.4 V for 20 min. produces etched holes on the semiconductor surfaces. The depths of the holes increase with decreasing potentials to −1.0 V. FIG. 2 depicts the profile of the etched hole formed at −1.0 V with light in a 2.2 M $HNO_3$ electrolyte. Potentials with more negative values produce etched holes with smaller depths. FIG. 3 depicts the etch rates as a function of potential in a 2.2 M $HNO_3$ electrolyte. The etch rates were calculated by dividing the depth by 20 min. The figure shows that the etch rate increases with decreases in potentials to a value of −1.0 V; these decreases in potentials increase the electron surface concentrations whereby greater quantities of indium are produced. The slight decrease in etch rate with more negative potential than −1.0 V is probably related to an increased in competition from the photoreduction of hydrogen ions.

The surface of the etched hole and the surrounding area for the sample etched at −1.0 V were examined with Auger electron spectroscopy. The chemical compositions of both the hole and the adjacent area were similar, consisting of InP, $InPO_4$ (or $In(PO_3)_3$), and oxides of indium. Indium oxides probably result from the oxidation of metallic indium on standing. The atom % (a/o) ratio of In-P/P-O shows that the etched hole contained approximately 2.7× the amount of phosphide as phosphate while the ratio for the surrounding area was 1.4. There was no nitrogen detected on the electrode at this concentration of nitric acid.

Figure 4:
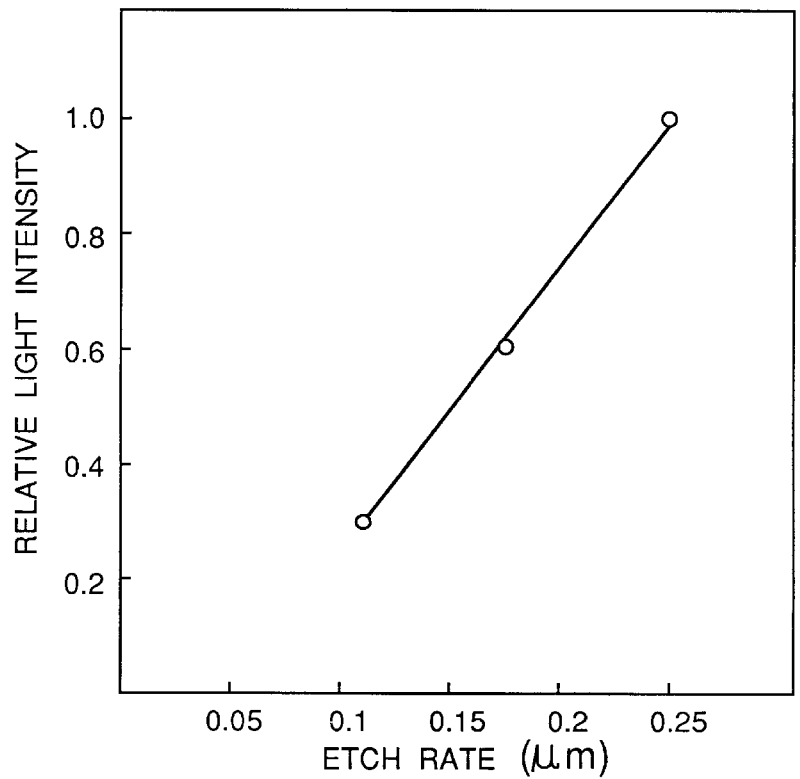
FIG. 4 illustrates photoelectrochemical etch rate of p-InP vs. relative light intensity in nitric acid solutions. Electrolyte, 2.2 M $HNO_3$; Voltage, −1.0 V; light intensity varied with neutral density filters.

FIG. 4 shows the etch rate as a function of relative light intensity. The light intensity was varied by the insertion of neutral density filters with absorbances of 0.22 and 0.52 in the light path. The Figure depicts a linear relationship between the etch rate and the light intensity, indicating that the etch rate is dependent on the photogeneration of electrons at the surface of the p-InP electrodes.

Figure 5:
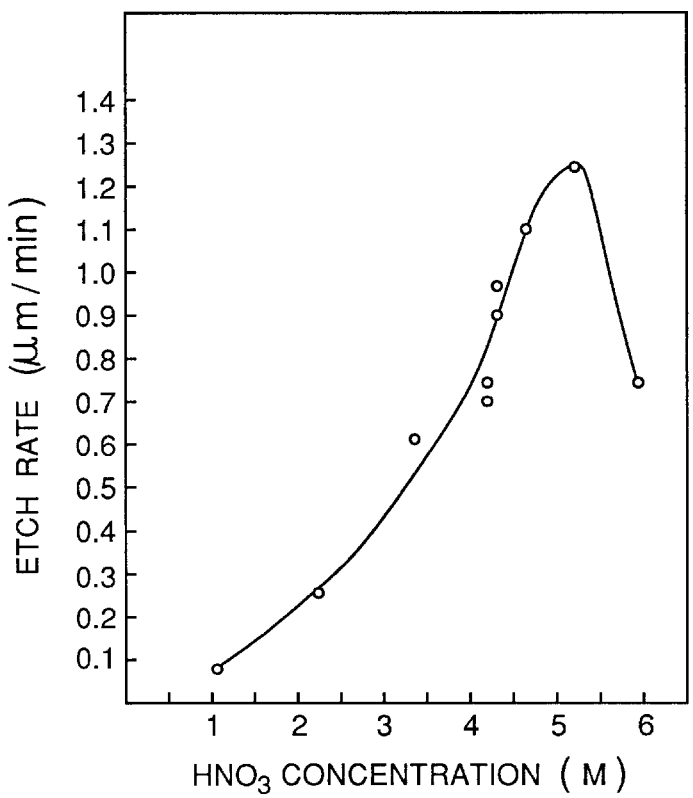
FIG. 5 illustrates photoelectrochemical etch rate of p-InP vs. nitric acid concentrations. Voltage, −1.0 V; light source, He-Ne laser (1.9 mW).

A study of the effect of different nitric acid concentrations on the formation of etched holes on p-InP surfaces was undertaken. The concentration of the nitric acid was varied from 1.0 to 9.0 M. FIG. 5 shows the results of the study where the etch rate is presented as a function of nitric acid concentration (1.0 to 5.7 M). The etch rate increases from 0.07 to 1.24 $\mu$m/min for acid concentrations ranging from 1.0 to 5.0 M. Duplicate runs made at 4.0 and 4.4 M $HNO_3$ and show agreements within 4%. The calculated amount of p-InP in 4.4 M $HNO_3$, using a cone to represent the etched hole, was $2.0 \times 10^{-5}$ grams. The amount corresponding to the number of coulombs/20 min was $2.6 \times 10^{-6}$ grams. This agreement of these values is surprising when one considers the uncertainties in the calculations and the photoreduction of hydrogen ions. These calculations lend credence to Eqs. 1 and 2 as the mechanism for the PEC etching.

Figure 6:
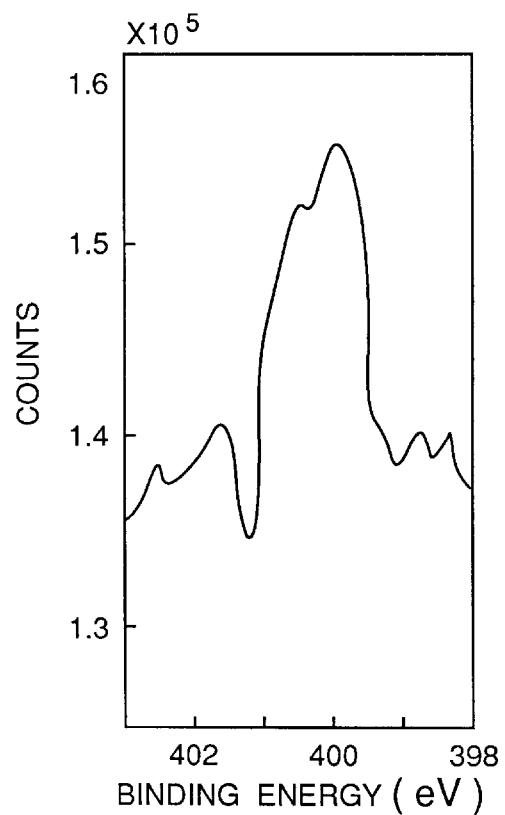
FIG. 6 illustrates XPS high resolution spectra of N is on surface of P-InP after 30 min. contact with 5.75 M $HNO_3$. Emission angle, 10°.

When the concentrations of $HNO_3$ is greater than 5 M, the determined etch rates were inconsistent e.g. two values determined at 5.75 M $HNO_3$ were 1.2 and 0.32 $\mu$m/min with an average of 0.74 $\mu$m/min. In fact, photoelectrochemical etching of p-InP was not observed for nitric acid concentrations ranging 7.5 to 9.0 M. The cause of this inhibition of etching at high concentrations of nitric acid was investigated using XPS to determine any changes in the composition of the p-InP surfaces. Various p-InP surfaces were analyzed with XPS after the samples were etched for 30 min with stirring with different concentrations of $HNO_3$ ranging from 0 to 8.0 M. The XPS high resolution spectra showed the usual presence of InP, $InPO_4$, and $In(OH)_3$, as previously reported, but at the high $HNO_3$ concentrations, nitrogen was present. FIG. 6 displays the XPS high resolution spectrum of N 1s displaying a binding energy of 400 eV. This binding energy corresponds to nitrogens in an organic environment. These compounds are probably formed from the reaction of $HNO_3$ with the carbon contaminants on the surfaces. The XPS studies indicated a significant quantity of carbon contaminants exist on the p-InP surfaces. A study of the a/o ratios of N/In and PO/InP indicated that a covering of organics containing nitrogen probably exist on the p-InP surface at high $HNO_3$ concentrations which inhibits the etching process. Table 1 shows the a/o ratios of N/In and $PO_x$/InP formed on p-InP surfaces when exposed to four $HNO_3$ concentrations. The data were collected at two emission angles, 10° and 60°; the results at 60° are more surface sensitive. The a/o ratio, N/In, increases with increasing concentrations of $HNO_3$. At lower concentrations of acid, there is little or no nitrogen present on the surface. The a/o ratio, N/In, increases to 0.67 and 0.71 for the 60° emission angle with the 5.7 and 8.0 M acid, respectively. These values indicate that approximately three atoms of nitrogen are present for every four atoms of indium at or near the surface. The nitrogens of the organic compounds probably coordinate to the surface indium to block the PEC etching. The small values of PO/InP at the high nitric acid concentrations indicate that phosphate has no effect on the PEC etching.

TABLE I

Atom %(a/o) ratio of N/In and PO$_X$/InP on p-InP
surfaces after etch with various HNO$_3$ solutions for 30 min.

| SAMPLE NO. | HNO$_3$Conc. M | XPS Emission | N/In | PO$_X$/N-P |
|---|---|---|---|---|
| E-195 | 0 | 10° | 0 | 0.25 |
|  |  | 60° | 0 | 0.42 |
| E-196 | 4.5 | 10° | 0.1 | 0.03 |
|  |  | 60° | 0 | 0.08 |
| E-197 | 5.7 | 10° | 0.25 | 0.02 |
|  |  | 60° | 0.67 | 0.20 |
| E-198 | 8.0 | 10° | 0.37 | 0.04 |
|  |  | 60° | 0.71 | 0.03 |

Clearly, many modifications and variations of the present invention are possible in light of the above teachings and it is therefore understood, that within the inventive scope of the inventive concept, the invention may be practiced otherwise than specifically claimed.

What is claimed is:

1. A method for photoelectrochemical etching of p-InP, said method consisting of the steps of:
    selecting an appropriate p-InP wafer;
    cleaning said wafer;
    attaching an electrode wire to said wafer;
    cleaning said wafer with said electrode wire attached;
    placing said wafer into an optical cell;
    placing a counterelectrode into said cell;
    placing one end of a salt bridge into said cell and the other end into a calomel reference electrode;
    attaching said wafer electrode wire, said counterelectrode and said reference electrode to a potentiostat being controlled by a programmer to adjust a voltage output as a function of time;
    placing a nitric acid solution into said optical cell;
    applying a selected negative voltage to said wafer for a selected length of time;
    concurrently applying a selected laser beam of a elected light intensity to said wafer for a selected length of time to etch said wafer;
    removing said wafer from said optical cell after said applying the selected laser beam; and
    cleaning said wafer.

2. A method as defined in claim 1 wherein said wafer has an orientation of (100).

3. A method as defined in claim 1 wherein said counterelectrode is made of platinum.

4. A method as defined in claim 1 wherein the applied negative potential ranged from about −0.1 to about −1.4 volts.

5. A method as defined in claim 4 wherein the applied negative potential is about −1.0 volts.

6. A method as defined in claim 1 wherein said laser outputs a beam of wavelength 632.8 nm at an energy of about 2 mW.

7. A method as defined in claim 6 wherein said laser irradiates said wafer for about 20 minutes.

8. A method as defined in claim 1 wherein said nitric acid solution has a concentration of about 1 to 5 M.

9. A method as defined in claim 8 wherein the concentration of nitric acid is about 4 M.

* * * * *